United States Patent
O'Brien et al.

(10) Patent No.: US 9,199,838 B2
(45) Date of Patent: Dec. 1, 2015

(54) THERMALLY SHORTED BOLOMETER

(71) Applicant: Robert Bosch GmbH, Stuttgart (DE)

(72) Inventors: Gary O'Brien, Palo Alto, CA (US); Fabian Purkl, Gerlingen (DE); Ando Feyh, Reutlingen (DE); Bongsang Kim, Mountain View, CA (US); Ashwin K Samarao, Mountain View, CA (US); Thomas Rocznik, Mountain View, CA (US); Gary Yama, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/504,749

(22) Filed: Oct. 2, 2014

(65) Prior Publication Data

US 2015/0115160 A1    Apr. 30, 2015

Related U.S. Application Data

(60) Provisional application No. 61/895,439, filed on Oct. 25, 2013.

(51) Int. Cl.
| | |
|---|---|
| *G01J 5/02* | (2006.01) |
| *B81B 7/00* | (2006.01) |
| *B81B 7/02* | (2006.01) |
| *G01J 5/08* | (2006.01) |
| *G01J 5/20* | (2006.01) |

(52) U.S. Cl.
CPC ............... *B81B 7/0019* (2013.01); *B81B 7/02* (2013.01); *G01J 5/024* (2013.01); *G01J 5/0245* (2013.01); *G01J 5/0853* (2013.01); *G01J 5/20* (2013.01); *B81B 2201/0207* (2013.01); *B81B 2207/11* (2013.01); *G02F 2201/083* (2013.01); *H01L 2924/1461* (2013.01)

(58) Field of Classification Search
CPC ............ G01J 5/0853; G01J 3/02; G01J 5/024
See application file for complete search history.

(56) References Cited

U.S. PATENT DOCUMENTS

| | | | |
|---|---|---|---|
| 5,260,233 | A | 11/1993 | Buti et al. |
| 5,300,915 | A | 4/1994 | Higashi et al. |

(Continued)

FOREIGN PATENT DOCUMENTS

| | | | |
|---|---|---|---|
| FR | 2872265 | A1 * | 12/2005 |
| JP | 2007263768 | A1 | 10/2007 |

(Continued)

OTHER PUBLICATIONS

M. Kimata, "MEMS-baed uncooled infrared focal plane arrays," 2007, IEEE, pp. 1357-1360.*

(Continued)

*Primary Examiner* — Kiho Kim
(74) *Attorney, Agent, or Firm* — Maginot Moore & Beck LLP

(57) ABSTRACT

In one embodiment, A MEMS sensor assembly includes a substrate, a first sensor supported by the substrate and including a first absorber spaced apart from the substrate, and a second sensor supported by the substrate and including (i) a second absorber spaced apart from the substrate, and (ii) at least one thermal shorting portion integrally formed with the second absorber and extending downwardly from the second absorber to the substrate thereby thermally shorting the second absorber to the substrate.

20 Claims, 5 Drawing Sheets

(56) References Cited

U.S. PATENT DOCUMENTS

| | | | |
|---|---|---|---|
| 5,310,449 | A | 5/1994 | Henderson |
| 5,399,897 | A | 3/1995 | Cunningham et al. |
| 6,218,667 | B1 | 4/2001 | Nonaka et al. |
| 6,441,374 | B1 | 8/2002 | Kawano et al. |
| 6,667,479 | B2 | 12/2003 | Ray |
| 6,707,121 | B2 | 3/2004 | De Moor et al. |
| 7,288,765 | B2 | 10/2007 | Vilain |
| 7,326,936 | B2 | 2/2008 | Kawano et al. |
| 7,554,085 | B2 | 6/2009 | Lee |
| 7,683,324 | B2 | 3/2010 | Vogt |
| 7,842,533 | B2 | 11/2010 | Liger |
| 7,868,298 | B2 | 1/2011 | Feyh |
| 7,875,485 | B2 | 1/2011 | Sasagawa et al. |
| 7,884,328 | B2 | 2/2011 | Cho et al. |
| 8,080,797 | B2 | 12/2011 | Vogt et al. |
| 2003/0062480 | A1 | 4/2003 | Kanzaki |
| 2003/0183307 | A1 | 10/2003 | Liebeskind et al. |
| 2004/0232337 | A1 | 11/2004 | Vilain |
| 2005/0082481 | A1 | 4/2005 | Vilain |
| 2006/0088980 | A1 | 4/2006 | Chen et al. |
| 2008/0265164 | A1 | 10/2008 | Ouvrier-Buffet et al. |
| 2009/0140148 | A1 | 6/2009 | Yang et al. |
| 2009/0152466 | A1 | 6/2009 | Cho et al. |
| 2009/0154872 | A1 | 6/2009 | Sherrer et al. |
| 2009/0207879 | A1 | 8/2009 | Kurashina |
| 2010/0171190 | A1 | 7/2010 | Liger |
| 2010/0197063 | A1 | 8/2010 | Bluzer et al. |
| 2011/0049366 | A1 | 3/2011 | Yang et al. |
| 2013/0234270 | A1 | 9/2013 | Yama et al. |
| 2014/0061845 | A1 | 3/2014 | Purkl et al. |

FOREIGN PATENT DOCUMENTS

| | | |
|---|---|---|
| WO | 2004025727 A1 | 3/2004 |
| WO | 2010080815 A1 | 7/2010 |

OTHER PUBLICATIONS

Reinert et al., "Vacuum wafer bonding technology," VABOND public report, in IMAPS Nordic 2004, 26 pages.

Yoneoka, S. et al., "ALD-Metal Uncooled Bolometer", IEEE 24th International Conference on Micro Electro Mechanical Systems, IEEE, United States, Jan. 23, 2011, pp. 676-679 (4 pages).

Akin, T., "CMOS-based Thermal Sensors," Ch. 10, CMOS-MEMS, p. 479-512, Feb. 29, 2008.

Lee, Hyung-Kew et al., "A High Fill-Factor Infrared Bolometer Using Micromachined Multilevel Electrothermal Structures", IEEE Transactions on Electron Devices, Jul. 1, 1999, vol. 46, No. 7, Pisacataway, NJ. (3 pages).

Forsberg, Fredrik et al., "High-Performance Infrared Micro-Bolometer Arrays Manufactured Using Very Large Scale Heterogeneous Integration", 2011 International Conference on Optical MEMS and Nanophotonics, Aug. 8, 2011, pp. 9-10 (2 pages).

Socher, Eran et al., "A Low-Cost CMOS Compatible Serpentine-Structured Polysilicon-Based Microbolometer Array", 12th International Conference on Transducers, Solid-State Sensors, Actuators and Microsystems, Jun. 9, 2003, pp. 320-323, vol. 1, Pisacataway, NJ (4 pages).

* cited by examiner

THERMALLY SHORTED BOLOMETER

CROSS REFERENCE

This application claims the benefit of U.S. Provisional Application No. 61/895,439 filed Oct. 25, 2013, the entire contents of which is herein incorporated by reference.

FIELD

This disclosure relates to sensor devices and methods of fabricating such devices.

BACKGROUND

Objects at any non-zero temperature radiate electromagnetic energy which can be described either as electromagnetic waves or photons, according to the laws known as Planck's law of radiation, the Stefan-Boltzmann Law, and Wien's displacement law. Wien's displacement law states that the wavelength at which an object radiates the most ($\lambda_{max}$) is inversely proportional to the temperature of the object as approximated by the following relation:

$$\lambda_{max}(\mu m) \approx \frac{3000}{T(K)}$$

Hence for objects having a temperature close to room temperature, most of the emitted electromagnetic radiation lies within the infrared region. Due to the presence of $CO_2$, $H_2O$, and other gasses and materials, the earth's atmosphere absorbs electromagnetic radiation having particular wavelengths. Measurements have shown, however, that there are "atmospheric windows" where the absorption is minimal. An example of such a "window" is the 8 µm-12 µm wavelength range. Another window occurs at the wavelength range of 3 µm-5 µm. Typically, objects having a temperature close to room temperature emit radiation close to 10 µm in wavelength. Therefore, electromagnetic radiation emitted by objects close to room temperature is only minimally absorbed by the earth's atmosphere. Accordingly, detection of the presence of objects which are either warmer or cooler than ambient room temperature is readily accomplished by using a detector capable of measuring electromagnetic radiation emitted by such objects.

Two types of electromagnetic radiation detectors are "photon detectors" and "thermal detectors". Photon detectors detect incident photons by using the energy of said photons to excite charge carriers in a material. The excitation of the material is then detected electronically. Thermal detectors also detect photons. Thermal detectors, however, use the energy of said photons to increase the temperature of a component. By measuring the change in temperature, the intensity of the photons producing the change in temperature can be determined.

In thermal detectors, the temperature change caused by incoming photons can be measured using temperature-dependant resistors (thermistors), the pyroelectric effect, the thermoelectric effect, gas expansion, and other approaches. One advantage of thermal detectors, particularly for long wavelength infrared detection, is that, unlike photon detectors, thermal detectors do not require cryogenic cooling in order to realize an acceptable level of performance.

One type of thermal sensor is known as a "bolometer." Even though the etymology of the word "bolometer" covers any device used to measure radiation, bolometers are generally understood to be to thermal detectors which rely on a thermistor to detect radiation in the long wavelength infrared window (8 µm-12 µm) or mid-wavelength infrared window (3 µm-5 µm).

The sensitivity of a bolometer generally increases with better thermal isolation of the sensor from its surroundings, with a higher infrared absorption coefficient, higher temperature coefficient of resistance, higher electrical resistance, and a higher bias current. Accordingly, because bolometers must first absorb incident electromagnetic radiation to induce a change in temperature, the efficiency of the absorber in a bolometer relates to the sensitivity and accuracy of the bolometer. Ideally, absorption as close to 100% of incident electromagnetic radiation is desired. In theory, a metal film having a sheet resistance (in Ohms per square) equal to the characteristic impedance of free space, laying over a dielectric or vacuum gap of optical thickness d will have an absorption coefficient of 100% for electromagnetic radiation of wavelength 4d. The following relation shows the expression of the characteristic impedance (Y) of free space:

$$Y = \sqrt{\frac{\mu_0}{\varepsilon_0}}$$

wherein $\varepsilon_0$ is the vacuum permittivity and $\mu_0$ is the vacuum permeability.

The numerical value of the characteristic impedance of free space is close to 377 Ohm. The optical length of the gap is defined as "nd", where n is the index of refraction of the dielectric, air or vacuum.

In the past, micro-electromechanical systems (MEMS) have proven to be effective solutions in various applications due to the sensitivity, spatial and temporal resolutions, and lower power requirements exhibited by MEMS devices. One such application is as a bolometer. Known bolometers use a supporting material which serves as an absorber and as a mechanical support. Typically, the support material is silicon nitride. A thermally sensitive film is formed on the absorber to be used as a thermistor. The absorber structure with the attached thermistor is anchored to a substrate through suspension legs having high thermal resistance in order for the incident electromagnetic radiation to produce a large increase of temperature on the sensor.

The traditional technique used to micromachine suspended members involves the deposition of the material over a "sacrificial" layer, which is to be eventually removed and which is deposited, e.g., by spin coating or polymer coating using a photoresist. The deposition of the thin-film metal or semiconductor can be done with a variety of techniques including low-pressure chemical vapor deposition (LPCVD), epitaxial growth, thermal oxidation, plasma-enhanced chemical vapor deposition (PECVD), sputtering, and evaporation.

Most of the known bolometers, however, have a generally rectangular absorber. Such absorbers exhibit reduced thermal isolation and low electrical resistance, lowering the responsivity of the device. U.S. patent application Ser. No. 13/975,577, filed Aug. 26, 2013, the entire contents of which are herein incorporated by reference, discloses an infrared sensor with increased sensitivity and efficient thermal absorption. While very effective, the device in the '577 does present some challenges.

One challenge is in the manner of incorporating a reference sensor. When measuring the voltage change of a bolometer subject to an incident infrared radiation with an integrated circuit, it is often beneficial to have reference sensors which do not react in the same way to infrared radiation to allow for a relative measurement. Such a reference sensor can be used to make the readout scheme more immune to process variations or temperature changes such as temperature changes of the substrate.

One approach to providing a reference sensor in known systems is to fabricate a sensor which is thermally shorted to the substrate. The substrate thus exchanges thermal energy with the sensor until the sensor has a temperature equal to the temperature of the substrate and the signal from the reference sensor can be used to correct for various errors. For traditional bolometer designs, which include a membrane suspended from the substrate by beams, a thermally shorted reference sensor is easily fabricated. Specifically, in the typical fabrication process a sensor membrane is released from the substrate by isotropically etching a sacrificial layer underneath the structure. Since the membrane size is significantly larger than the distance of the membrane to the substrate, release holes are included in the membrane to decrease the amount of underetch required to release the devices. The reference sensor is thus easily fabricated simply by omitting the release holes. With an appropriate etch time, the infrared sensors will be released while sacrificial material will remain between the reference sensor and the substrate, thermally shorting the reference sensor.

The known method of fabricating thermally shorted sensors as a reference sensor does not work with the devices disclosed in the '577 application. The serpentine structures disclosed in the '577 application are fabricated using a fast release etch without the requirement of release holes. As a result, the method of forming a reference sensor described above does not work for this improved structure.

It would be beneficial to provide a thermally shorted reference sensor that can be fabricated using the same manufacturing processes used in fabricating fast-release sensors. It would be advantageous if such a reference sensor could be fabricated while providing greater flexibility in the release etch time of the sensors.

SUMMARY

In one embodiment a MEMS sensor assembly includes a reference sensor with an absorber including a plurality of spaced apart conductive legs defining a tortuous path with a plurality of anchors provided along the tortuous path which thermally short the absorber to the substrate.

In another embodiment, a MEMS sensor assembly includes a reference sensor with an absorber having a plurality of spaced apart conductive legs defining a tortuous path with the absorber substantially continuously connected to the underlying substrate along the tortuous path.

In another embodiment, A MEMS sensor assembly includes a substrate, a first sensor supported by the substrate and including a first absorber spaced apart from the substrate, and a second sensor supported by the substrate and including (i) a second absorber spaced apart from the substrate, and (ii) at least one thermal shorting portion integrally formed with the second absorber and extending downwardly from the second absorber to the substrate thereby thermally shorting the second absorber to the substrate.

In one or more embodiments, the first absorber includes a plurality of spaced apart first conductive legs defining a first tortuous path across a first area above the substrate, the second absorber includes a plurality of spaced apart second conductive legs defining a second tortuous path across a second area above the substrate, and the at least one thermal shorting portion extends downwardly from at least one of the plurality of spaced apart second conductive legs.

In one or more embodiments, the at least one thermal shorting portion comprises a single thermal shorting leg extending downwardly from each of the plurality of spaced apart second conductive legs.

In one or more embodiments, the at least one thermal shorting portion comprises a plurality of thermal shorting legs, each of the plurality of thermal shorting legs extending downwardly from a respective one of the plurality of spaced apart second conductive legs.

In one or more embodiments, the at least one thermal shorting portion comprises a plurality of thermal shorting legs, each of the plurality of thermal shorting legs associated with a respective two of the plurality of spaced apart second conductive legs.

In one or more embodiments, the at least one thermal shorting portion directly contacts an upper surface of the substrate.

In one or more embodiments, the assembly includes a first conductive pad in electrical communication with the second absorber, the first conductive pad formed on an upper surface of an insulator layer of the substrate, and the at least one thermal shorting portion directly contacts a second conductive pad formed on an upper surface of an insulator layer of the substrate and electrically isolated from the first conductive pad.

In one or more embodiments, the at least one thermal shorting portion includes a hollow thermal shorting post.

In one or more embodiments, each of the plurality of spaced apart second conductive legs comprises a plurality of layers.

In one or more embodiments, the plurality of layers comprise a substrate layer, a first conductive layer on an upper surface of the substrate layer, and an insulation layer on an upper surface of the conductive layer, and the at least one thermal shorting portion comprises a second conductive layer integrally formed with the first conductive layer.

In another embodiment, a method of forming a MEMS sensor assembly includes providing a substrate layer, supporting a first absorber with the substrate at a first location spaced apart from the substrate, supporting a second absorber with the substrate at a second location spaced apart from the substrate, and integrally forming at least one thermal shorting portion with the second absorber, the at least one thermal shorting portion extending downwardly from the second absorber to the substrate thereby thermally shorting the second absorber to the substrate.

In one or more embodiments, providing a substrate layer includes providing an insulator layer on an upper surface of a handle layer, the method further including forming a pair of electrical contacts on an upper surface of the insulating layer, and placing the electrical contacts in electrical communication with the second absorber.

In one or more embodiments, integrally forming at least one thermal shorting portion includes forming a sacrificial layer on respective upper surfaces of the pair of electrical contacts and on the upper surface of the insulating layer, etching at least one trench completely through the sacrificial layer to expose portions of the insulating layer, and depositing a conductive layer along a wall of the at least one trench while depositing second absorber material above an upper surface of the sacrificial layer.

In one or more embodiments, a method includes forming a serpentine trench in the sacrificial layer, wherein depositing the conductive layer along the wall of the at least one trench includes depositing the conductive layer along the wall of the at least one trench while depositing second absorber material within the serpentine trench.

In one or more embodiments, depositing the conductive layer along the wall of the at least one trench further includes depositing the conductive layer along the wall of the at least one trench while depositing second absorber material within the serpentine trench by atomic layer deposition (ALD).

In one or more embodiments, depositing the conductive layer along the wall of the at least one trench further includes depositing the conductive layer on the wall of the at least one trench to form a hollow post.

In one or more embodiments, depositing the conductive layer along the wall of the at least one trench further includes depositing the conductive layer on an insulating layer formed along the wall of the at least one trench.

In one or more embodiments, a method includes forming an insulating layer on the conductive layer deposited along the wall of the at least one trench.

In one or more embodiments, a method includes etching the sacrificial layer after depositing the conductive layer.

In one or more embodiments, etching at least one trench completely through the sacrificial layer includes etching a serpentine trench completely through the sacrificial layer to expose portions of the insulating layer and portions of the pair of electrical contacts.

DESCRIPTION

Figure 1:
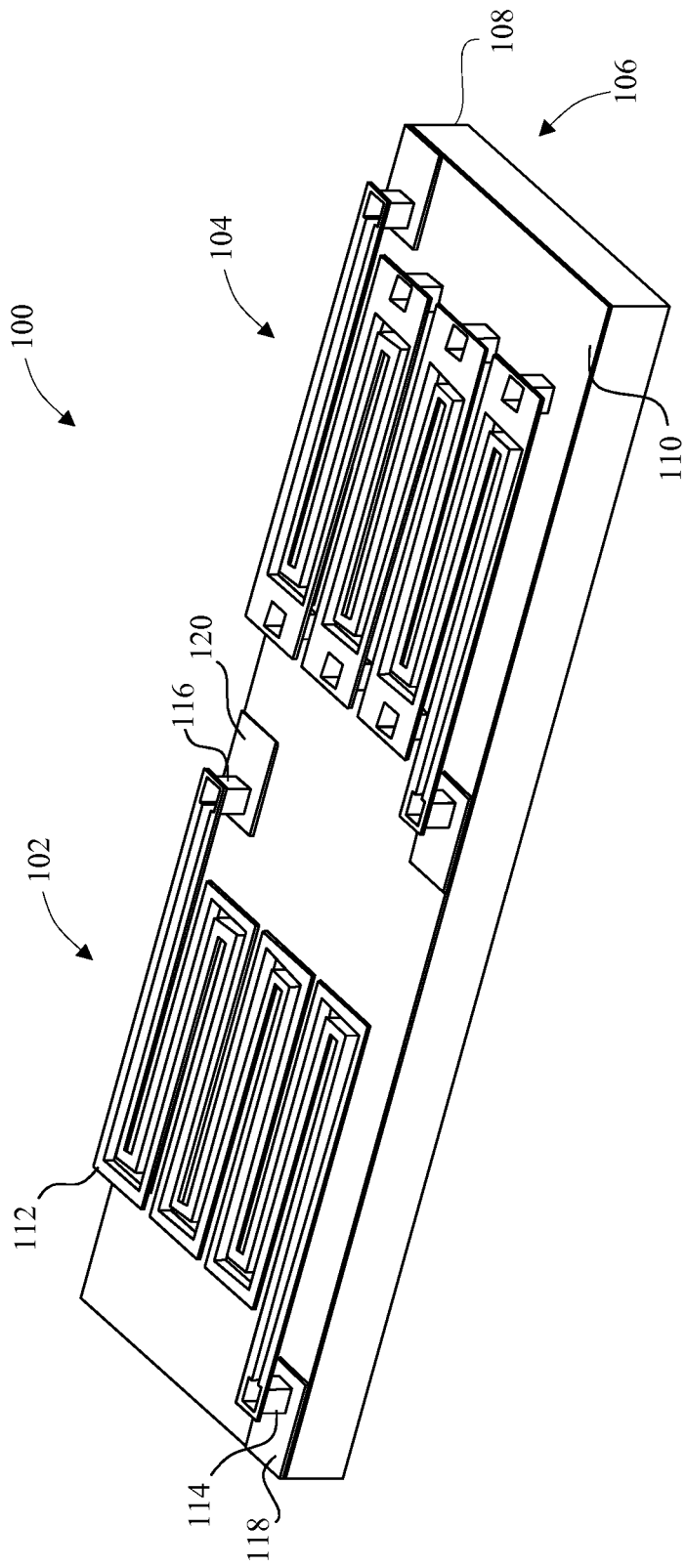
FIG. 1 depicts a top perspective view of a bolometer sensor assembly including a bolometer sensor and a thermally shorted reference sensor in accordance with principles of the disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the disclosure includes any alterations and modifications to the illustrated embodiments and includes further applications of the principles of the disclosure as would normally occur to one skilled in the art to which this disclosure pertains.

A semiconductor sensor assembly 100 is depicted in FIG. 1. The sensor assembly 100 includes a bolometer sensor 102 and a thermally shorted reference bolometer sensor 104 upon a common substrate 106. The substrate 106 in one embodiment is a complementary metal oxide semiconductor (CMOS) substrate or another type of substrate and includes a handle layer 108 and an insulator layer 110. The substrate 106 in some embodiments includes the electronic circuitry used to access the output of the sensor assembly 100. The insulator layer 110 in one embodiment is a deposited dielectric like, e.g., $SiO_2$.

The sensor 102 includes an absorber 112 which is supported by two support posts 114 and 116. A mirror (not shown) may be located beneath the absorber 112. Two conductive pads 118 and 120 provide electrical connectivity with the support posts 114/116, respectively. Because the only connection between the absorber 112 and the substrate 106 is at the support posts 114 and 116, the absorber 112 is effectively thermally isolated from the substrate 106. In other embodiments, the absorber has a different shape such as, for example, a square or other shape or pattern.

The absorber 112 is a free-standing serpentine wire structure. The free-standing serpentine wire structure provides better thermal isolation and higher electrical resistance (and therefore a higher responsivity) without an increase in size over typical absorber structures which are generally rectangular. For example, the serpentine nature of the absorber 112 increases the lineal distance along the absorber 112 between the posts 114/116 by a factor of over 5 compared to a rectangular absorber.

The absorber 112, in addition to absorbing energy from incident photons, is selected to provide a good noise-equivalent temperature difference (NETD). In order for the absorber 112 to have a good NETD, the material selected to form the absorber 112 should exhibit a high temperature coefficient of resistance while exhibiting low excess noise (1/f noise). Semiconductor materials such as vanadium oxide are common in micromachined bolometers due to their high temperature coefficient of resistance. Other materials include Si (poly/amorphous), SiGe, Ge, Pt, TiN, Ti, and combinations of the foregoing. While metals have a lower temperature coefficient of resistance than some semiconductor materials, such as vanadium oxide, metals typically have much lower excess noise than many semiconductor materials, thus offering better NETD.

Accordingly, in one embodiment the absorber 112 comprises metal. Titanium and Platinum are two metals which exhibit desired characteristics. Titanium, for example, exhibits a bulk resistivity of about $7*10^{-7}$ Ohm. Using a bulk resistivity of $7*10^{-7}$ Ohm, the thickness of the absorber 112 needed to match the impedance of free-space (377 Ohm/square) should be about 1.9 nm. The resistivity of materials formed to a thickness less than about 50 nm, however, can be several times higher than the bulk value. Accordingly, depending on process parameters, the thickness of the absorber 112, if made from titanium, is preferably about 10 nm. Impurities can also be introduced into the absorber 112 during formation in order to tune the resistivity if needed.

Figure 2:
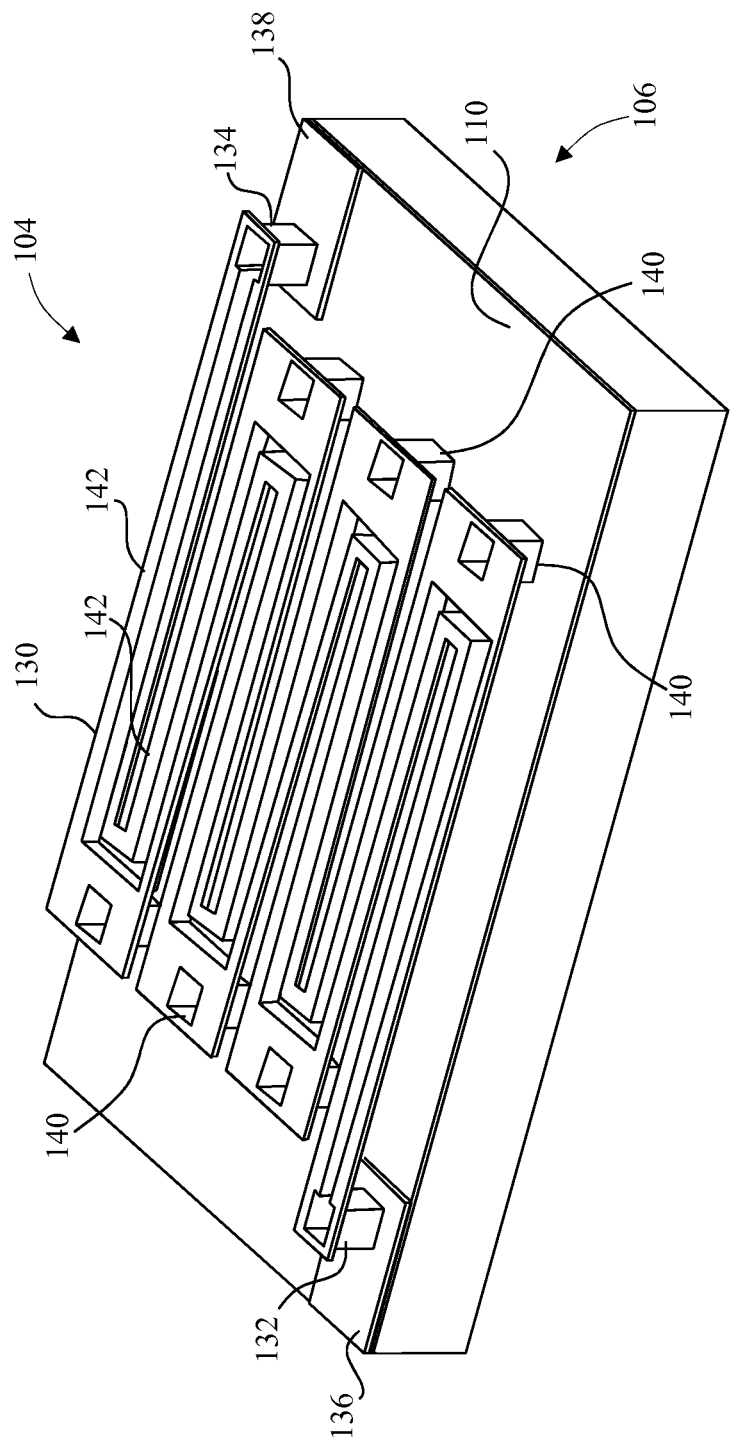
FIG. 2 depicts a top perspective view of the thermally shorted reference sensor of FIG. 1.

The reference sensor 104 is also shown in FIG. 2. The reference sensor 104 includes an absorber 130 which is supported by two support posts 132 and 134. Two conductive pads 136 and 138 provide electrical connectivity with the support posts 132/134, respectively. If desired, a mirror may be positioned beneath the absorber 130. In the foregoing respects, the reference sensor 104 is identical to the sensor 102. The reference sensor 104 further includes, however, a number of shorting posts 140. As depicted in FIG. 2, each of the thermal shorting posts 140 is associated with a pair of legs 142.

The shorting posts 140 are formed using the same process steps used to form the supporting posts 132 and 134 with the exception that the shorting posts 140 in this embodiment are formed directly upon the upper surface of the insulator layer 110. This is easily accomplished by simply omitting the formation of a conductive pad such as the conductive pads 136/138 under the shorting posts 140 as discussed in further detail below. The shorting posts 140 are thus electrically isolated from the conductive pads 136 and 138, but provide a thermal conducting path between the substrate 106 and the absorber 130.

In other embodiments, the shorting posts 140 terminate at the same layer as the conductive pads 136. In such embodiments, the areas supporting the posts can be isolated areas or one connected area of the conductive material formed. The shorting posts can be floating or electrically connected, e.g. to ground or to the same potential as one of the pads 136/138. Therefore the identical process flow can be used as is used for forming the contact/supporting posts 132/134.

In some embodiments, the shorting posts 140 extend into the handle layer 108. Additionally, while six shorting posts 140 are depicted in FIG. 2, more or fewer posts are used in other embodiments to provide a desired amount of thermal conductivity. Moreover, while the shorting posts in FIG. 2 are positioned at the ends of the seven absorber legs 142, the shorting posts in other embodiments are additionally or alternatively positioned along the absorber legs. The shorting posts in the other embodiments would thus be associated with a single absorber leg.

Because the absorber 130 and support posts 132/134 of the reference sensor 104 are substantially identical to the absorber 112 and support posts 114/118, and because the shorting posts are configured to have minimal impact on the overall electrical characteristics of the reference sensor 104, the reference sensor 104 and sensor 102 share the same electrical characteristics. The increased sensitivity of the sensor 104 to the temperature of the substrate 106 through the shorting posts 140, however, allows a relative measurement of the resistance change caused by substrate temperature with an integrated circuit. The signal from the reference sensor 104 is thus used to suppress influences of process variations and cross-sensitivity to e.g. substrate temperature changes.

Returning to FIG. 1, the total resistance for the sensor 102 measured across the support posts 114/116 and the absorber 112 is defined by the following equation:

$$R = n * R_a$$

where n is the number of linear leg portions and $R_a$ is the resistance of one of the linear leg portions, which together form the absorber 112. The resistance of the support posts 114/116 is de minimis because of the relatively large bulk of material and the short length compared to the support leg portions.

Upon impingement of the absorber 112 with electromagnetic radiation, the average temperature of the absorber 112 increases by ΔT. The electrical resistance of the sensor upon incident radiation changes by an amount ΔR given by:

$$\Delta R = \alpha n R_a \Delta T$$

where α is the temperature coefficient of resistance of the thin film.

In one embodiment, the width of the linear leg portion is significantly smaller than the wavelength of the infrared radiation to be measured (8 µm-12 µm or 3 µm-5 µm) (also referred to as the "target" wavelength). Therefore, the assembly of linear leg portions is seen as an effective medium by the incoming infrared radiation and forms an efficient absorber.

In one embodiment, the gaps between the linear leg portions is significantly smaller than the target wavelength (8 µm-12 µm or 3 µm-5 µm). Therefore, the assembly of linear leg portions as a total are seen as an effective medium by the incoming infrared radiation and forms an efficient absorber. Thus, the incoming IR radiation sees an increased effective sheet resistance and the aforementioned 377 ohm condition can be achieved with higher film thicknesses.

When electromagnetic radiation (e.g. infrared light) reaches the sensor assembly 102, the electromagnetic radiation is absorbed within the thin-film metal of the absorber 112 with an efficiency depending on the resistivity of the absorber 112, quality of the mirror (not shown), gap height between the absorber 112 and the mirror, and radiation wavelength. Upon absorbing the incident radiation, the absorber 112 undergoes an increase in temperature. This temperature increase, in turn, leads to either a decrease or increase of the resistivity of the absorber 112. The absorber 112 is then electrically probed to measure the resistivity of, and thus indirectly measure the amount of incident electromagnetic radiation on, the absorber 112.

The reference sensor 104 operates in substantially the same manner as the sensor 102. The main difference is that the thermal resistance of the absorber to the substrate is significantly smaller. For a given power of infrared radiation impinging on the absorber, the temperature increase of the absorber (ΔT) is therefore significantly smaller. With a favorable layout of the shorting posts 140, the temperature difference caused by the infrared radiation can be made negligible. Then, the temperature of the absorber 130 is dominated by the temperature of the substrate 106 which is transferred to the absorber 130 by the shorting posts 140. The signal from the reference sensor 104 is then used to compensate for thermal conditions in the substrate and/or other influences of process variations and cross-sensitivity.

Figure 3:
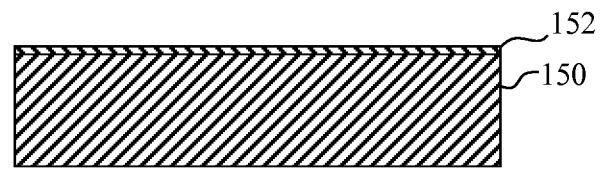
FIG. 3 depicts a side cross-sectional view of a device substrate which in this embodiment is a complementary metal oxide semiconductor (CMOS), with an insulator layer formed on the substrate in accordance with principles of the disclosure.

Fabrication of a sensor assembly such as the sensor assembly 100 begins with preparation of a substrate 150 which is shown in FIG. 3. While the following description highlights formation of the reference sensor, the bolometer sensor is formed simultaneously and substantially as described except where noted. The substrate 150 may be a portion of a larger substrate that is used to form a number of sensors and reference sensors. An insulator layer portion 152 is formed on the upper surface of the substrate 150. In this example, an oxide film of about 1000 Å is formed on the substrate 150.

Figure 4:
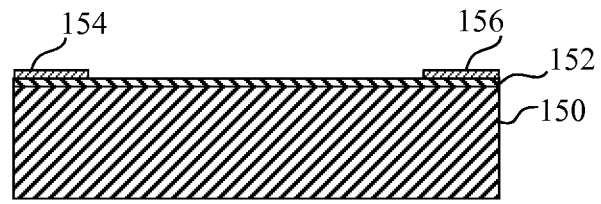
FIG. 4 depicts a side cross-sectional view of the device of FIG. 3 after electrical contacts have been formed on the insulator layer.
Figure 5:
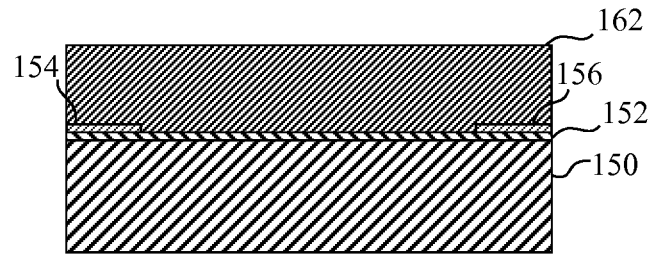
FIG. 5 depicts a side cross-sectional view of the device of FIG. 4 after a sacrificial layer has been formed above the electrical contacts.

Next, electrical contacts 154 and 156 are formed on the upper surface of the insulator layer portion 152 (FIG. 4). The electrical contacts 154/156 are formed from a conducting metal by any acceptable process such as one incorporating lithography and plasma etching. A sacrificial layer 162 is then formed thereby encapsulating the electrical contacts 154/156 (FIG. 5). The sacrificial layer 162 may be planarized if desired.

Figure 6:
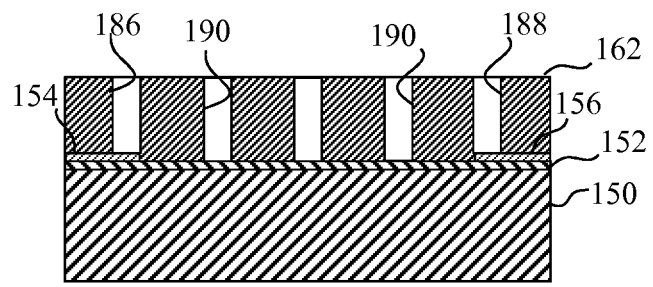
FIG. 6 depicts a side cross-sectional view of the device of FIG. 5 with trenches formed through the sacrificial layer to expose the electrical pads and a portions of the insulator layer.

Openings 186 and 188 are formed by etching trenches completely through the sacrificial layer 162 to expose portions of the electrical contacts 154 and 156, respectively (FIG. 6). Trenches 190 are also formed. The trenches 190 extend completely through the sacrificial layer 162. In areas of the substrate 150 used for bolometer sensors, the formation of the trenches 190 is omitted. A serpentine trench (not shown) is then formed in the sacrificial layer 162 connecting the openings 186, 188 and 190. The openings 186/188/190 and the trench (not shown) may be formed using spin photoresist and lithography, for example.

Figure 7:
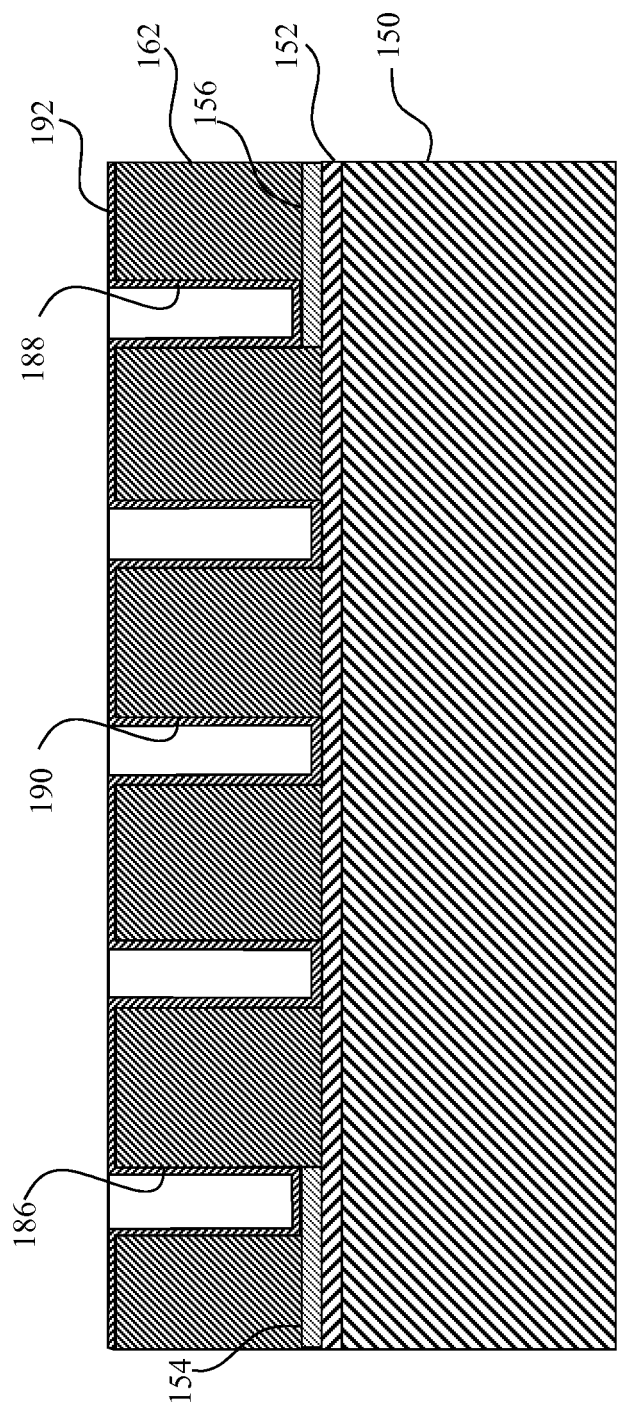
FIG. 7 depicts a side cross-sectional view of the device of FIG. 6 with an absorber layer formed on the exposed surfaces.

An absorber layer 192 (see FIG. 7) is then formed on the exposed surfaces of the openings 186/188/190 and the trench (not shown). The absorber layer 192 in some embodiments is formed by atomic layer deposition (ALD). ALD is used to deposit materials by exposing a substrate to several different precursors sequentially. A typical deposition cycle begins by exposing a substrate is to a precursor "A" which reacts with the substrate surface until saturation. This is referred to as a "self-terminating reaction." Next, the substrate is exposed to a precursor "B" which reacts with the surface until saturation. The second self-terminating reaction reactivates the surface. Reactivation allows the precursor "A" to react with the surface. Typically, the precursors used in ALD include an organometallic precursor and an oxidizing agent such as water vapor or ozone.

The deposition cycle results, ideally, in one atomic layer being formed. Thereafter, another layer may be formed by repeating the process. Accordingly, the final thickness of the absorber layer 192 is controlled by the number of cycles a substrate is exposed to. Moreover, deposition using an ALD process is substantially unaffected by the orientation of the particular surface upon which material is to be deposited. Accordingly, an extremely uniform thickness of material may be realized both on the horizontal surfaces (the insulator layer portion 152, the exposed surface portions of the electrical contacts 154/156, and the bottom of the serpentine trench) and on the vertical surfaces (the sides of the openings 186 and 188, the walls of the trenches 190). Thus, in some embodiments the posts 114/116/132/134 and shorting posts 140 are hollow, and may be further anchored as described in U.S. patent application Ser. No. 13/415,479, filed Mar. 8, 2012, the entire contents of which are herein incorporated by reference.

In some embodiments, it may be desired to form structures using multiple layers of ALD material. For example, while the device in the example includes a single absorber layer 192, a stacked absorber may be useful in different embodiments. A stacked absorber or other structure may have two, three, or more layers of different or alternating materials. For example, a layer of insulating material may provide a substrate for a layer of a conducting material with yet another insulating material above the conducting material. A very thin conducting layer may thus be protected and strengthened by being sandwiched between two very thin insulating layers. $Al_2O_3$ may be used as an insulating layer deposited using ALD.

Once the absorber layer 192 is formed, portions of the absorber layer 192 may be removed to provide the desired shape of the absorber and the sacrificial layer 162 is then etched to form the final device, such as the sensor assembly 100 of FIG. 1.

Figure 8:
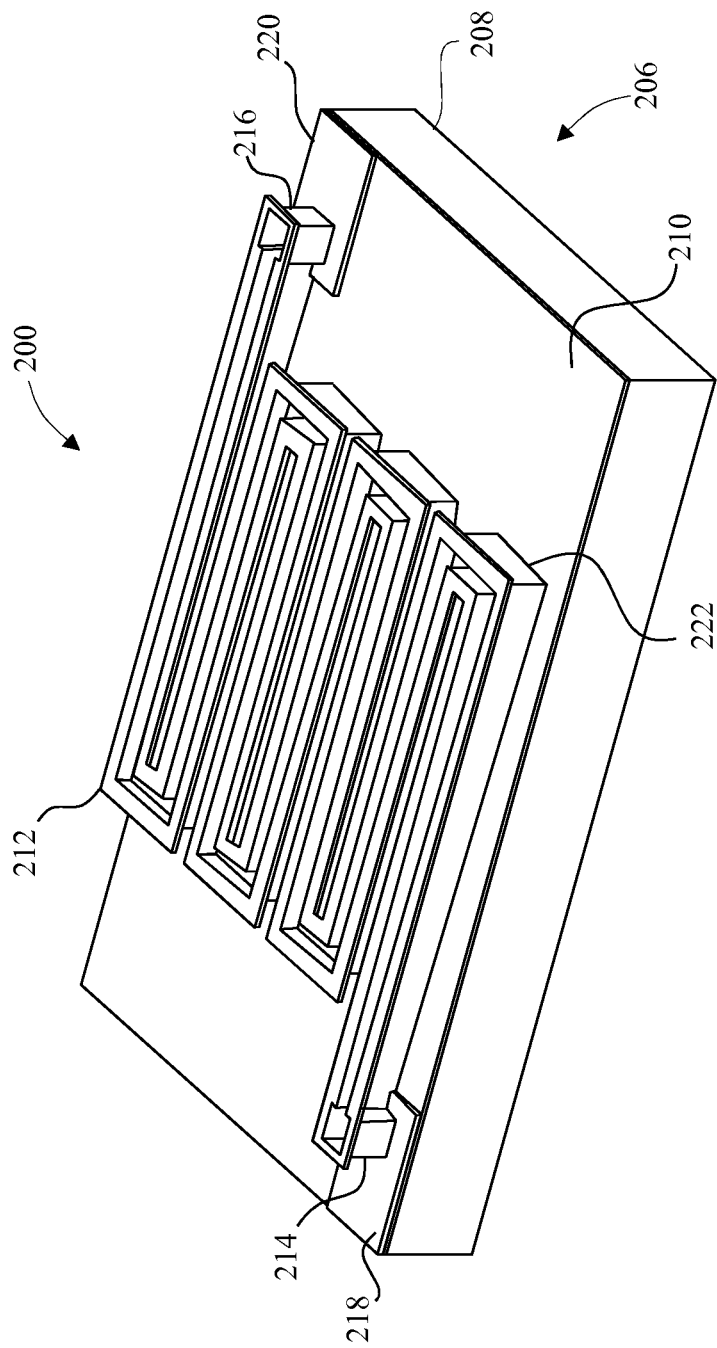
FIG. 8 depicts a top perspective view of a thermally shorted reference sensor in accordance with principles of the disclosure.

The above described process discloses a method to fabricate a reference bolometer which is thermally shorted to the substrate by including additional structures (e.g. shorting posts) which are in contact with an electrically isolating part of the substrate. The process in different embodiments is modified for a particular application. For example, FIG. 8 depicts a reference sensor 200 that in some embodiments is included in the sensor assembly 100 of FIG. 1. The reference sensor 200 includes a substrate 206 with a handle layer 208 and an insulator layer 210. The reference sensor 200 includes an absorber 212 which is supported by two support posts 214 and 216. Two conductive pads 218 and 220 provide electrical connectivity with the support posts 214/216, respectively.

In place of six discrete shorting posts such as the shorting posts 140, the reference sensor 200 includes a single shorting post 222 which extends along the entire length of the absorber 112. The shorting post 222 functions in the same manner as the shorting posts 140. Like the shorting posts 140, the shorting post 222 can be formed without adding any steps to a forming process used to form a sensor such as the sensor 102. For example, the shorting post 222 in one embodiment is formed using essentially the same process described above. The difference being that instead of forming the trenches 190 which are used to form the support posts 140, the serpentine trench (not shown) used to form the serpentine absorber is extended down to the upper surface of the insulator layer 152.

Accordingly, the above disclosure provides a reference sensor in assemblies including fast-etch absorbers without adding processing steps. The disclosed method offers greater flexibility in the release etch time as the formation of the thermally shorted bolometer does not depend on a timed etch.

Moreover, while the absorbers in the above described embodiments are generally "U" shaped, other forms can be incorporated with the above described shortening posts such as those forms disclosed in the '577 application as well as forms disclosed in U.S. patent application Ser. No. 13/415,479, filed Mar. 8, 2012, the entire contents of which are herein incorporated by reference. Additionally, the processes in the '577 application and the '479 application can be modified to provide shorting posts using the procedures discussed above.

The disclosure thus provides a bolometer that is thermally shorted to the substrate with a serpentine-like absorber structure instead of a membrane. The disclosed reference structure provides the same electrical resistance as the functional bolometer in the assembly. By the incorporation of multiple of the described reference structures over a bolometer chip, the reference sensors are used in some embodiments to sense gradients e.g. in process variations or substrate temperature. The disclosed reference structures can be used in Wheatstone bridges together with functional bolometers or other electrical circuits used to reduce measurement offsets.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A MEMS sensor assembly comprising:
a substrate;
a first sensor supported by the substrate and including a first absorber spaced apart from the substrate; and
a second sensor supported by the substrate and including (i) a second absorber spaced apart from the substrate, (ii) two support posts supporting the absorber above the substrate and in electrical communication with the absorber, and (iii) at least one thermal shorting portion integrally formed with the second absorber, the at least one thermal shorting portion extending downwardly from the second absorber toward the substrate at a location between the two support posts and configured to thermally short the second absorber to the substrate.

2. The MEMS sensor assembly of claim 1, wherein:
the first absorber includes a plurality of spaced apart first conductive legs defining a first tortuous path across a first area above the substrate;
the second absorber includes a plurality of spaced apart second conductive legs defining a second tortuous path across a second area above the substrate; and the at least one thermal shorting portion extends downwardly from at least one of the plurality of spaced apart second conductive legs.

3. The MEMS sensor assembly of claim 2, wherein the at least one thermal shorting portion comprises a single thermal shorting leg extending downwardly from each of the plurality of spaced apart second conductive legs.

4. The MEMS sensor assembly of claim 2, wherein the at least one thermal shorting portion comprises a plurality of thermal shorting legs, each of the plurality of thermal shorting legs extending downwardly from a respective one of the plurality of spaced apart second conductive legs.

5. The MEMS sensor assembly of claim 2, wherein the at least one thermal shorting portion comprises a plurality of thermal shorting legs, each of the plurality of thermal shorting legs associated with a respective two of the plurality of spaced apart second conductive legs.

6. The MEMS sensor assembly of claim 5, wherein:
the plurality of layers comprise a substrate layer, a first conductive layer on an upper surface of the substrate layer, and an insulation layer on an upper surface of the conductive layer; and
the at least one thermal shorting portion comprises a second conductive layer integrally formed with the first conductive layer.

7. The MEMS sensor assembly of claim 2, wherein the at least one thermal shorting portion directly contacts an upper surface of the substrate.

8. The MEMS sensor assembly of claim 7, wherein:
the assembly includes a first conductive pad in electrical communication with the second absorber, the first conductive pad formed on an upper surface of an insulator layer of the substrate; and
the at least one thermal shorting portion directly contacts a second conductive pad formed on an upper surface of an insulator layer of the substrate and electrically isolated from the first conductive pad.

9. The MEMS sensor assembly of claim 2, wherein the at least one thermal shorting portion comprises:
a hollow thermal shorting post.

10. The MEMS sensor assembly of claim 9, wherein each of the plurality of spaced apart second conductive legs comprises a plurality of layers.

11. A method of forming a MEMS sensor assembly comprising:
providing a substrate layer;
supporting a first absorber with the substrate at a first location spaced apart from the substrate with a first pair of support posts in electrical communication with the first absorber;
supporting a second absorber with the substrate at a second location spaced apart from the substrate with a second pair of support posts in electrical communication with the second absorber; and
integrally forming at least one thermal shorting portion with the second absorber, the at least one thermal shorting portion extending downwardly from the second absorber toward the substrate thereby thermally shorting the second absorber to the substrate.

12. The method of claim 11, wherein providing a substrate layer comprises providing an insulator layer on an upper surface of a handle layer, the method further comprising:
forming a pair of electrical contacts on an upper surface of the insulating layer; and
placing the electrical contacts in electrical communication with the second absorber through the second pair of support posts.

13. The method of claim 12, wherein integrally forming at least one thermal shorting portion comprises:
forming a sacrificial layer on respective upper surfaces of the pair of electrical contacts and on the upper surface of the insulating layer;
etching at least one trench completely through the sacrificial layer to expose portions of the insulating layer; and
depositing a conductive layer along a wall of the at least one trench while depositing second absorber material above an upper surface of the sacrificial layer.

14. The method of claim 13, further comprising:
forming a serpentine trench in the sacrificial layer, wherein depositing the conductive layer along the wall of the at least one trench comprises:
depositing the conductive layer along the wall of the at least one trench while depositing second absorber material within the serpentine trench.

15. The method of claim 14, wherein depositing the conductive layer along the wall of the at least one trench further comprises:
depositing the conductive layer along the wall of the at least one trench while depositing second absorber material within the serpentine trench by atomic layer deposition (ALD).

16. The method of claim 15, wherein depositing the conductive layer along the wall of the at least one trench further comprises:
depositing the conductive layer on the wall of the at least one trench to form a hollow post.

17. The method of claim 15, wherein depositing the conductive layer along the wall of the at least one trench further comprises:
depositing the conductive layer on an insulating layer formed along the wall of the at least one trench.

18. The method of claim 17, further comprising:
forming an insulating layer on the conductive layer deposited along the wall of the at least one trench.

19. The method of claim 18, further comprising:
etching the sacrificial layer after depositing the conductive layer.

20. The method of claim 12, wherein etching at least one trench completely through the sacrificial layer comprises:
etching a serpentine trench completely through the sacrificial layer to expose portions of the insulating layer and portions of the pair of electrical contacts.

* * * * *